United States Patent
Cernea

(10) Patent No.: US 6,493,269 B1
(45) Date of Patent: Dec. 10, 2002

(54) DUAL CELL READING AND WRITING TECHNIQUE

(75) Inventor: Raul-Adrian Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/871,332

(22) Filed: May 31, 2001

(51) Int. Cl.$^7$ .............................................. G11C 16/04
(52) U.S. Cl. .............................. 365/185.28; 365/185.27
(58) Field of Search .................... 365/185.28, 185.27, 365/185.26, 185.03, 185.01, 185.24, 185.14

(56) References Cited

U.S. PATENT DOCUMENTS

| | | | | |
|---|---|---|---|---|
| 5,095,344 A | | 3/1992 | Harari | 357/23.5 |
| 5,258,949 A | * | 11/1993 | Chang et al. | 365/185.19 |
| 5,313,421 A | | 5/1994 | Guterman et al. | 365/185 |
| 5,576,992 A | * | 11/1996 | Mehrad | 365/185.24 |
| 5,587,949 A | * | 12/1996 | Bergemont et al. | 365/185.03 |
| 5,703,808 A | * | 12/1997 | Makwana et al. | 365/185.27 |
| 5,712,180 A | | 1/1998 | Guterman et al. | 437/43 |
| 6,151,248 A | | 11/2000 | Harari et al. | 365/185.14 |

* cited by examiner

*Primary Examiner*—David Lam
(74) *Attorney, Agent, or Firm*—Skjerven Morrill LLP; Gerald P. Parsons; Gergely T. Zimanyi

(57) ABSTRACT

The cells of a memory cell array are programmed in a pair wise manner. The pairs are separated by at least one memory cell, reducing the possibility of interference between the pairs during programming. The memory cells are programmed individually by applying a relatively high voltage to one of the bit lines of each cell regardless whether the cells are to be programmed or not, while applying a lower voltage to the second bit lines, depending on whether the cells are to be programmed or not. This programming voltage assignment enhances the speed of programming. Furthermore, the pair wise programming scheme applies the necessary high voltages only half as often as in previous schemes to program all the cells of the array, increasing the lifetime of the memory system.

28 Claims, 6 Drawing Sheets

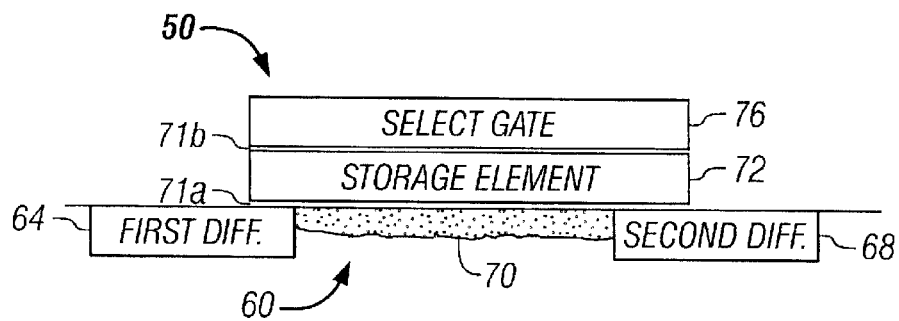
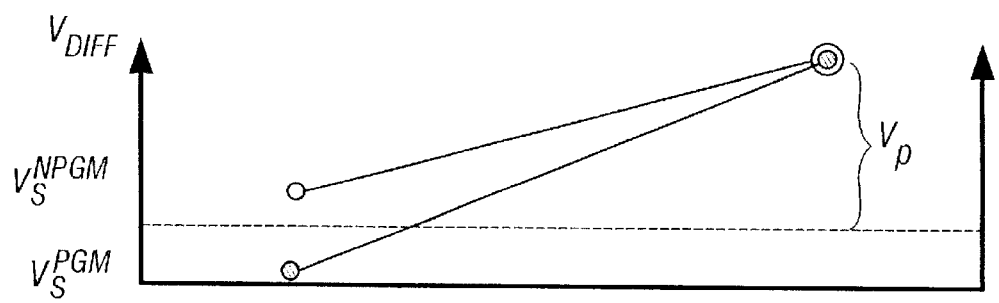
FIG. 3A
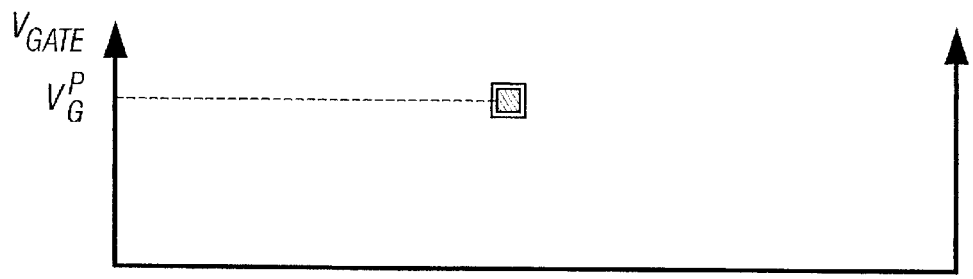
FIG. 3B
FIG. 3C
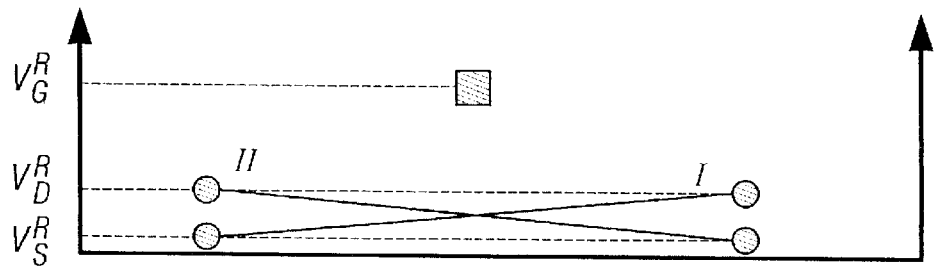
FIG. 3D

DUAL CELL READING AND WRITING TECHNIQUE

BACKGROUND

1. Field of Invention

The invention relates to programming floating gate memory cells, and in particular to improved techniques of reading and writing of dual floating gate memory cells.

2. Discussion of Related Art

There are many commercially successful non-volatile memory products being used today, particularly in the form of small cards, which use an array of flash EEPROM cells. The basic architecture of an individual EEPROM memory cell includes source and drain diffusions, coupled by a channel, formed in a semiconducting substrate. The storage element itself is positioned above the channel, separated from it by a dielectric layer. This storage element is often referred to as a floating gate. Overlying the storage element there can be a select gate, used to address the individual cell for programming and reading.

Some designs include a split channel architecture, as described, for example, in U.S. Pat. No. 5,095,344, granted to E. Harari, which is incorporated herein by this reference in its entirety. In a split channel cell both the storage element and the select gate overlie the channel partially. This design has the advantage of simplicity, but the select gate performs the multiple functions of addressing the individual cells to be programmed or read, as well as the function of participating in the actual programming or reading of the cells as well.

Another design introduces an additional steering gate, positioned between the storage element and the select gate. The select gate continues to carry out the addressing function and even may contribute to the programming, but the primary programming and reading functions are performed by the steering gate, as described, for example, in U.S. Pat. No. 5,313,421, granted to D. Guterman et al., which is incorporated herein by this reference in its entirety.

Higher storage densities can be achieved by a dual cell design, as described, for example, in U.S. Pat. No. 5,712,180, granted to D. Guterman et al., which is incorporated herein by this reference in its entirety. There are two floating gates per cell in the dual cell architecture, overlying portions of the same channel. Corresponding steering gates are positioned above the floating gates. The select gate is formed above the steering gates and also overlies the channel itself.

In an array of cells the select gates of the memory cells along a row are coupled to form a word line along that row. The diffusions in different rows are aligned and coupled to form bit lines across the rows. Also, the steering gates in different rows are aligned and coupled to form steering lines. A recent design of a memory cell array is described in U.S. Pat. No. 6,151,248, granted to E. Harari, which is incorporated herein by this reference in its entirety.

Flash EEPROM memories hold some key advantages over other types of memory systems. One of these advantages is the non-volatile nature of the data storage, making these systems prime candidate for a wide variety of applications, including digital cameras, recording music and utilization in mobile communications.

A characteristic of flash memory systems is, however, the relatively long time it takes to program the cells. Programming can take as long as 10–1000 microseconds, longer than, for example, present day DRAMs.

Many cells are programmed simultaneously in the memory systems. The cells of the array are selected for programming in a certain scheme. The speed of the programming is influenced by this scheme. In some arrays the simultaneous programming is performed, for example, on every fourth, or every seventh cell only. Therefore these schemes require four or seven programming cycles to program all the cells of the array, respectively.

Thus programming schemes which program memory arrays in fewer cycles are desired.

The programming speed is affected also by the operating speed of the individual circuit elements involved. For example, if the input/output circuitry is slower than the internal array circuitry, the overall operating speed of the memory system will be restricted by the speed of the input/output circuitry. The input/output circuitry can be slow, for example, because relatively high voltages have to be applied to program some of the arrays. In order to handle higher voltages, the thickness of the oxide layers of the programming circuit elements has to be increased. This in turn slows down the operating speed of these circuit elements.

Therefore improvements in programming voltage assignments in the memory arrays are desired.

Another aspect of the quality of flash EEPROM related products is their expected lifetime. The lifetime is influenced by several factors. One of them is associated with the relatively high voltages needed to program the memory cells. Every time these relatively high programming voltages are applied, some degree of wear occurs in the memory cell, thereby limiting the useful lifetime of the memory cell.

Thus programming schemes reducing the number of instances, when high programming voltages have to be applied have the potential of extending the lifetime of flash memory based products.

SUMMARY OF INVENTION

Briefly and generally, the cells of a memory array are programmed in a new, pair wise programming scheme. The cells are programmed by the application of a data-independent high voltage and a data-dependent low voltage. This novel programming scheme and voltage assignment has the advantage of increasing the speed of the programming and the lifetime of the memory cell array.

According to one aspect of the invention a new programming scheme is introduced. The cells of a memory cell array are programmed in a novel, pair wise scheme. The programmed pairs of cells are separated by at least one memory cell, reducing the possibility of interference between the pairs during programming. This scheme is capable of programming all cells of the array in three programming cycles. Previous methods, which program every fourth or every seventh memory cell of an array in one cycle, are only capable of programming all cells of the array in four or seven cycles, respectively.

According to another aspect of the invention new programming voltage assignments are introduced. The memory cells of an array are typically associated with two bit lines. In existing memory systems a relatively high voltage is applied to one of the cell's bit lines, if the cell is to be programmed, while applying a low voltage to the second bit line of the cell irrespective whether the cell is to be programmed or not. The programming circuit elements, including input/output circuitry, buses, and drivers, have to be capable of handling these relatively high voltages. This is achieved, among others, by increasing the thickness of the oxide layers of the involved semiconductor devices. Devices with thicker oxide layers, however, operate slower, eventually reducing the speed of reading of the whole array.

The novel programming voltage assignments according to an aspect of the invention eliminate the necessity of thicker semiconductor layers in the programming circuit elements because the memory cell is programmed by applying the relatively high voltage to one of the bit lines irrespective whether the cell is to be programmed or not. The programming of the cell is controlled instead by the voltage applied to the second bit line of the cell. Both the programming and the non-programming voltages, applied to the second bit line, are lower than the relatively high voltage applied to the first bit line. Therefore the programming circuit elements, including the input/output circuitry, buses, and drivers, can all operate at lower voltages. This allows for utilizing thinner oxide layers, thus enhancing the operating speed of the programming circuit elements and eventually the overall performance of the circuit.

The lifetime of memory cells is also affected by the above programming scheme and programming voltage assignments. As mentioned above, every time a high voltage is applied to a bit line, some degree of wear occurs, shortening the lifetime of the cell. In the pair wise programming scheme, however, the application of the high programming voltage to one bit line programs two memory cells. Therefore high programming voltages have to be applied only half as often as in previous schemes to program all the cells of the array, increasing the lifetime of the memory system.

BRIEF DESCRIPTION OF DRAWINGS

FIGS. 3a–d. Memory cell with select gate on top of storage element and voltage levels for programming and reading.

DETAILED DESCRIPTION OF EMBODIMENTS

Figure 1:
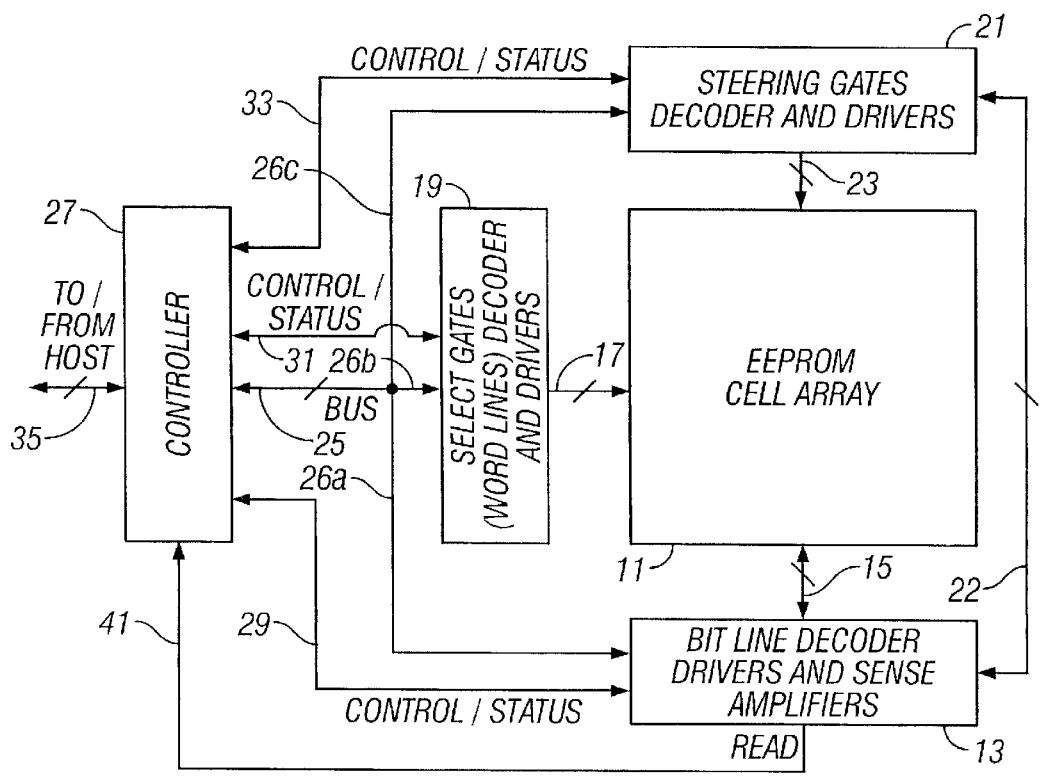
FIG. 1. Block diagram of a memory system, with an array of flash memory cells.

FIG. 1 shows a block diagram of a memory system controlling and driving an array of memory elements. A large number of individually addressable memory cells 11 are arranged in a regular array of rows and columns. Individual memory cells can be controlled by bit lines, s elect gates and steering gates. Bit lines are designated herein to extend along columns of array 11, and word lines are designated to extend along the rows of array 11. Bit line unit 13 may include a bit line decoder, storage elements, driver circuits and sense amplifiers. Bit line unit 13 can be coupled to cell array 11 by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 21 may include a steering gate decoder and driver circuits. Steering unit 21 can be coupled to cell array 11 by line 23, to controller 27 by steering-control line 33, and to bit line unit 13 by line 22. Bit line unit 13, word line unit 19 and steering unit 21 can be coupled to bus 25, which in turn is coupled to controller 27. Controller 27 can be coupled to the host by line 35.

When a preselected memory cell is to be programmed, voltages can be applied to the bit lines, word line and steering gates, corresponding to the preselected memory cell, at predetermined levels sufficient for the programming of the preselected cell. Controller 27 sends the address of the preselected memory cell through bus 25 to the respective decoders in bit line unit 13, word line unit 19, and steering gate unit 21 through lines 26a, 26b, and 26c, respectively. Status and control commands between bit line unit 13, word line unit 19, steering gate unit 21 and controller 27 are communicated through bit-control line 29, word-control line 31 and steering line 33.

When a preselected memory cell is to be read, voltages can be applied to the corresponding bit lines, word line and steering gates, corresponding to the preselected memory cell, at predetermined levels, sufficient to enable the reading of the preselected memory cell. Controller 27 is capable of applying the voltages of the bit lines through bit-control line 29, the voltage of the word line through word-control line 31 and the voltage of steering gates through steering line 33. A current can be generated through the preselected memory cell by these voltages. The current is indicative whether the preselected memory cell was programmed or not. The value of the current can be amplified by sense amplifiers in bit line unit 13, and temporarily stored in latches or registers. The data, read out from the preselected memory cell, can be sent to controller 27 through read line 41.

Figure 2:
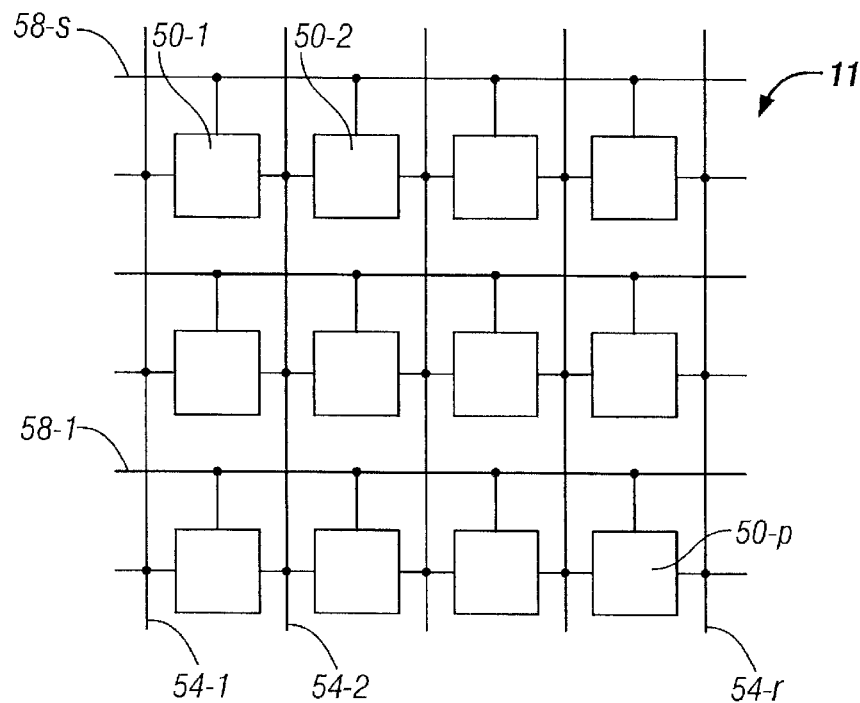
FIG. 2. Schematic view of an array of memory cells.

FIG. 2 shows a layout of an array of memory cells 50-1 through 50-p. Memory cells are coupled to bit lines 54-1 through 54-r and word lines 58-1 through 58-s. Here p, r, and s are positive integer numbers. Memory cells are selected for programming or reading by applying voltages to the corresponding bit lines, between which the preselected memory cell is positioned. For example memory cell 50-1 is selected by applying a voltage between bit lines 54-1 and 54-2, and applying another voltage to word line 58-s.

FIG. 3 illustrates an embodiment of the invention in relation to a single memory cell 50. The architecture of the memory cell is shown in FIG. 3a. In a semiconductor substrate 60, which can be made of, for example, silicon, a first diffusion 64 and a second diffusion 68 can be formed, for example, by ion implantation and subsequent diffusion of dopants into substrate 60. Dopants can be either n-type or p-type, forming conductive regions within substrate 60. A channel 70 is formed for conduction between first diffusion 64 and second diffusion 68 in substrate 60. At least partially overlying channel 70 is a storage element 72, which can be formed by, for example, depositing and subsequently etching a polysilicon layer. Storage element 72 can be, for example, a floating gate, which can be separated from substrate 60 by a dielectric layer 71a. Another polysilicon layer 76 can be deposited and etched overlying storage element 72 to form select gate 76, separated from storage element 72 by dielectric layer 71b.

In the following the programming and reading voltage assignments will be described. The voltage levels will be specified for the case of n-type doping. The invention is meant to include the case of p type doping as well, in which case the voltages have to be appropriately modified. Furthermore the magnitudes of the voltages are meant to be illustrative only, the actual voltage values can vary from one implementation to another.

FIG. 3b shows the programming voltages of memory cell 50 according to this embodiment of the invention. A voltage $V_D$ is applied to the second diffusion 68, which plays the role of a drain. Simultaneously a $V_S^{PGM}$ voltage is applied to first diffusion 64, which plays the role of a source, if the cell is to be programmed, or a $V_S^{NPGM}$ voltage is applied to first diffusion 64, if the memory cell is not to be programmed. Applying a $V_S^{NPGM}$ voltage can be achieved, for example, by setting the voltage of first diffusion 64 to a $V_S^{NPGM}$ level, or by "floating" the voltage of first diffusion 64 by disconnecting it from the circuit.

According to the current—voltage characteristics of memory cell 50, when the difference between the second diffusion voltage $V_D$ and first diffusion voltage $V_S$, $V_D-V_S$, is increased from zero, at some fixed voltage $V_G$ of select gate 76, $V_G$ being bigger than a threshold voltage $V_T$, the current between first and second diffusions 64 and 68, $I_{DS}$, increases until $V_D-V_S$ exceeds $V_P$, where $V_P$ is the voltage necessary for producing hot electrons. For $V_D-V_S$ larger than $V_P$, while the current does not increase considerably, the electrons still acquire high energy during transport, becoming "hot electrons". The polarity of the voltage $V_G$ of select gate 76 is chosen to attract these hot electrons onto storage element 72. The diversion of the current onto storage element 72 has the effect of reducing the current $I_{DS}$ reaching second diffusion 68. It also leads to a buildup of charges on storage element 72. This charging of storage element 72 is called "programming." Thus, for programming storage element 72 the voltage of first diffusion 64, $V_S$, is chosen such that the voltage difference between second and first diffusions, $V_D-V_S^{PGM}$ exceed $V_P$, whereas for not programming storage element 72 $V_S$ is chosen such that the voltage difference between second and first diffusions, $V_D-V_S^{NPGM}$, is less than $V_P$. The two cases are separated by the dotted line in FIG. 3b. Programming voltages are shown in solid symbols, and non-programming voltages are shown in open symbols. Applying a $V_S^{NPGM}$ voltage can be achieved by setting $V_S$ to a value $V_S^{NPGM}$, or by letting $V_S$ float by disconnecting it from the rest of the circuit. Applying a $V_S^{PGM}$ voltage includes setting $V_S$ to ground voltage $V_{GND}$. Programming by others methods, such as tunneling from channel 70 onto storage element 72 can also be utilized in other embodiments.

In a virtual ground architecture with no pre-assigned function for the diffusions, the voltage of either the first or the second diffusion, $V_D$ or $V_S$, has to exceed $V_P$ to have a difference greater than $V_P$. In past memory programming schemes the data dependent voltage was chosen to exceed $V_P$. However the input of memory systems is often coupled to computer logic or it is driven by battery operated voltage sources, both operating at voltages low compared to the $V_P$ voltage difference, necessary for programming the memory cell. Therefore voltage pumps had to be formed to step up the data dependent voltage to values equal or higher than $V_P$. Also, the circuitry carrying the data had to be formed to be capable of operating at higher voltages. This required forming thicker oxide layers, which, for example, slowed down the response time of the circuitry.

The various embodiments of the invention offer an improvement in these areas by introducing the data dependence at the lower of the voltages $V_D$ and $V_S$. This programming scheme eliminates the need for voltage pumps and allows the use of thinner semiconductor layers in the data carrying circuitry, speeding up the programming or read process.

FIG. 3c shows the operating voltage of the steering gate, $V_G$. For low values of $V_G$ channel 70 essentially does not allow for electric conduction, it is "closed". With increasing $V_G$ channel 70 opens for conduction.

During the programming a high enough $V_G^P$ has to be applied to open channel 70. FIG. 3c shows that $V_G$ assumes the same value during non-programming as well: this way gate voltage $V_G$ does not have to be data dependent, simplifying the circuitry.

The reading of the status of storage element 27 is based on the phenomenon that the charges of storage element 72 generate a voltage, which contributes to the conduction of channel 70. Thus, with the appropriate choice of the gate voltage $V_G$, channel 70 will be closed or open, depending on whether storage element 72 is programmed or not, respectively. When a $V_D-V_S$ voltage difference is applied along channel 70 between first and second diffusions 64 and 68, the generated current $I_{DS}$ will be bigger, if channel 70 is open, than when channel 70 is closed. From the measurement of the current $I_{DS}$ thus the programming status of memory cell 50 can be read off. FIG. 3d represents schematically the voltage values of first and second diffusions 64 and 68, and steering gate 76 for the reading of memory cell 50, which comply with these principles.

As shown in FIG. 3d, for reading the polarity of the first and second diffusion voltages may remain the same (I), or may be reversed (II) relative to the programming. Throughout the application the convention will be followed that the higher of the two diffusion voltages is identified as $V_D$ and the lower as $V_S$. Thus, depending on which diffusion is the higher voltage applied to, the assignment of "drain" and "source" can change, as it did in the present read operation.

FIG. 4 illustrates another embodiment of the invention. FIG. 4a shows the architecture of memory cell 50, which differs from FIG. 3 in that storage element 72 overlies channel 70 only partially, and select gate 76 itself now overlies channel 70 partially.

Figure 4A:
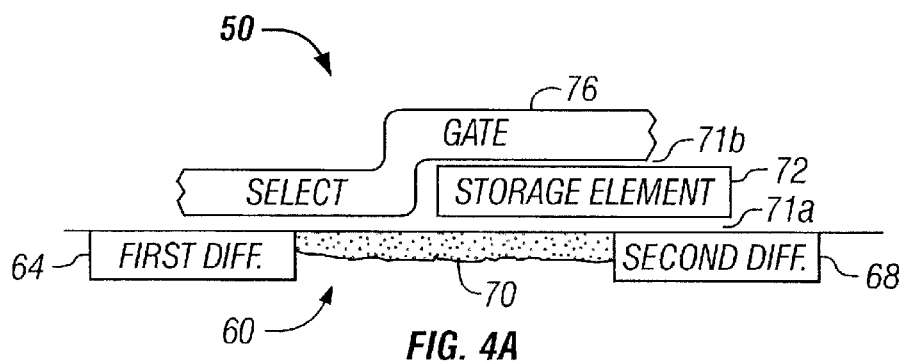
FIGS. 4a–d. Memory cell with select gate partially on top of storage element and voltage levels for programming and reading.
Figure 4B:
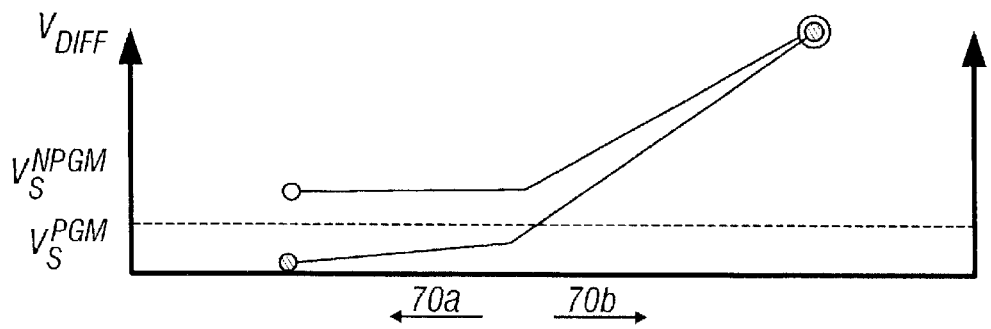

FIG. 4b illustrates the method of programming, which is similar to that of the previous embodiment. A difference is that the voltage of select gate 76, $V_G$, now itself contributes to the voltage of channel 70, and thus it increases the energy of the electrons in channel portion 70a, where select gate 76 overlies channel 70. Along channel portion 70a the voltage change along channel 70 is moderate, thus a large part of the total $V_D-V_S$ voltage difference is concentrated along channel portion 70b, as shown in FIG. 4b. As the electrons move along channel 70 under the joint influence of select gate voltage 76 and voltage difference $V_D-V_S$ their energy increases and they become hot electrons. The hot electrons in channel portion 70b are then diverted by gate voltage $V_G$ onto storage element 72. The $V_S^{PGM}$ and $V_S^{NPGM}$ voltages are set according to the same principles as in the previous embodiment.

This embodiment offers the advantages of generating hot electrons efficiently, and of allowing for an additional method of controlling the programming of memory cell 70.

Figure 4C:
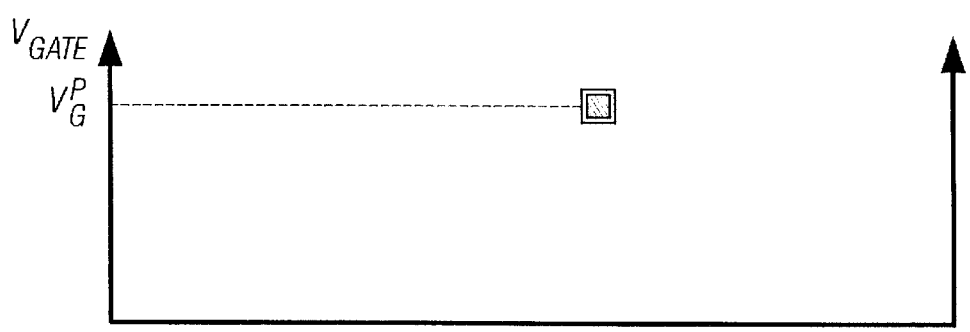

FIG. 4c shows that a $V_G$ voltage is applied to select gate 76 to open channel 70 both for programming and non-programming. Thus again the voltage applied to select gate 76 is not dependent on the data, simplifying the circuitry.

Figure 4D:
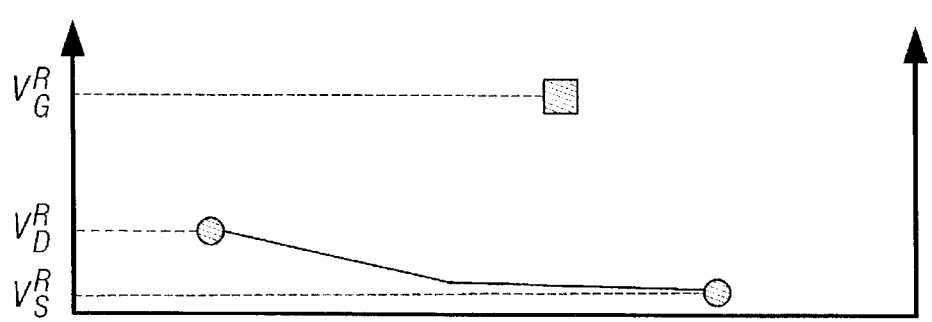

FIG. 4d shows the diffusion and select gate voltages applied during reading, which are analogous to FIG. 3d.

FIG. 5 shows some further embodiment of the invention. FIG. 5a shows the architecture of memory cell 50 according to this embodiment, called a dual cell. In semiconductor substrate 60 channel 70 is formed between first diffusion 64 and second diffusion 68. First storage element 72a and second storage element 72b are formed partially overlying channel 70, and isolated from channel 70 by dielectric layers. Storage elements 72a and 72b can be, for example, floating gates. Overlying storage elements 72a and 72b are first steering gate 74a and second steering gate 74b, respectively. Select gate 76 is formed overlying first and second steering gates 74a and 74b, and partially overlying channel 70. Diffusions 64 and 68, storage elements 72a and 72b, steering gates 74a and 74b and select gate 76 can be formed, for example, in silicon by n- or p-type doping, ion implantation and etching.

Figure 5A:
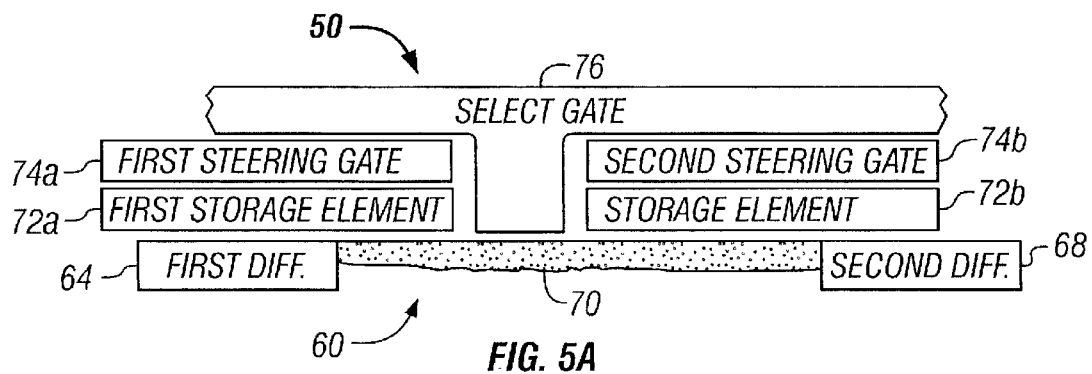
FIGS. 5a–d. Dual memory cell and voltage levels for programming and reading second storage element.
Figure 5B:
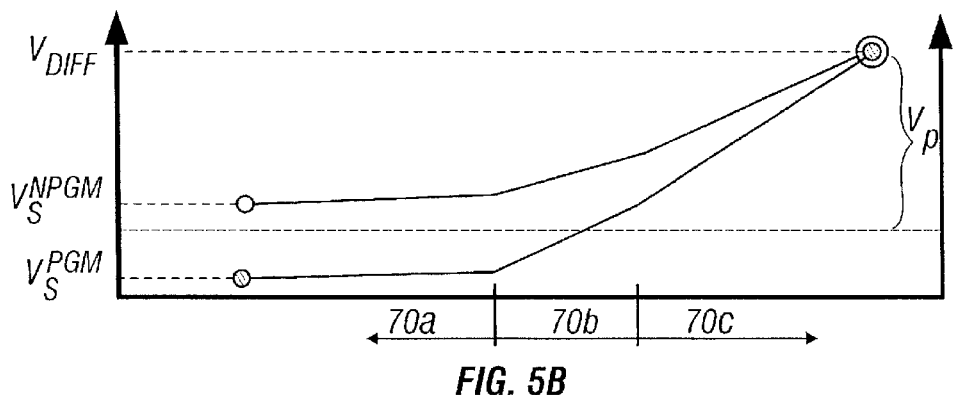

FIG. 5b illustrates the programming of data into memory cell 50, in particular programming into second storage element 72b. A $V_G^{OD}$ ("overdrive") voltage can be applied to first steering gate 74a to unconditionally open channel portion 70a for transport. Because of the non-linear current—voltage characteristics of the device, at $V_G^{OD}$ large $I_{DS}$ currents can be sustained with a moderate voltage difference along channel portion 70a, as shown in FIG. 5b. The current $I_{DS}$ then enters channel portion 70b. Here the voltage of select gate 76 is chosen so that a bigger voltage difference is experienced along channel portion 70b, than along channel portion 70a by the same current $I_{DS}$, thus the energy of the electrons increases and they become hot electrons. In channel portion 70c the hot electrons can be diverted to storage element 72b by the voltage of second steering gate 74b, if second storage element 72b is to be programmed. The diverted electrons can charge up storage element 72b, in effect programming it.

The creation of hot electrons also requires that the voltage difference between second and first diffusions 68 and 64, $V_D-V_S$, exceed $V_P$, the voltage necessary to create hot electrons. As shown in FIG. 5b, in this embodiment again the lower of the two voltages, $V_S$, is applied according to the data. Therefore this embodiment offers the advantages described above in detail. Storage element 72b will be programmed, if a $V_S$ voltage is applied with a value $V_S^{PGM}$ so that $V_D-V_S^{PGM}$ exceeds $V_P$, and it will not be programmed, if a $V_S$ voltage is applied with a value $V_S^{NPGM}$ so that $V_D-V_S^{PGM}$ is less than $V_P$. Applying a $V_S^{NPGM}$ voltage can be achieved by setting $V_S$ to a value $V_S^{NPGM}$, or by letting $V_S$ float by disconnecting it from the rest of the circuit. Applying a $V_S^{PGM}$ voltage includes setting $V_S$ to ground voltage $V_{GND}$. Again, programming can be achieved by methods other than hot electrons as well, including electron tunneling from channel portion 70c onto storage element 72b.

Figure 5C:
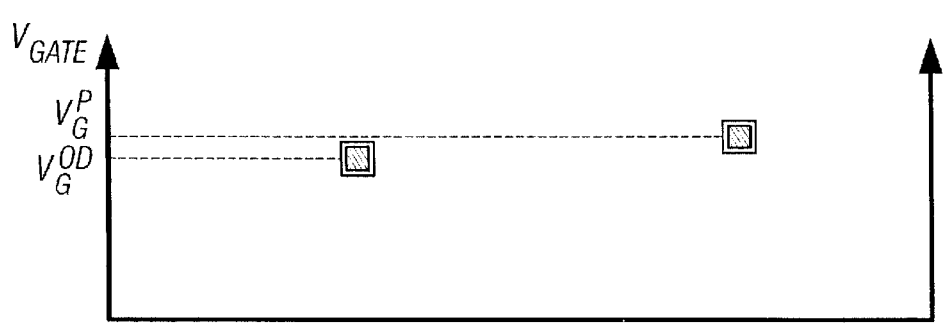

FIG. 5c shows the programming voltages applied to steering gates 74a and 74b according to the present embodiment. As described above, an overdrive voltage $V_G^{OD}$ can be applied to first steering gate 74a, which is capable of unconditionally opening channel portion 70a. A programming voltage $V_G^P$ can be applied to second steering gate 74b, which is capable of diverting a portion of current $I_{DS}$ onto storage element 72b, if storage element 72b is to be programmed. A voltage is applied to select gate 76 capable of generating hot electrons.

Figure 5D:
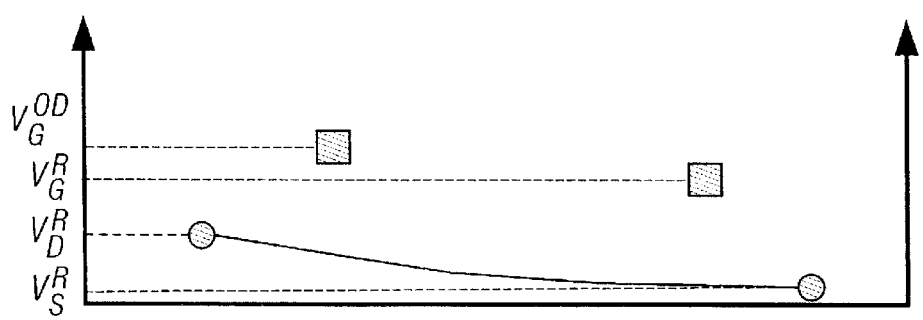

FIG. 5d shows the voltages for the reading of storage element 72b. A $V_G^{OD}$ voltage can be applied to first steering gate 74a capable of opening channel portion 70a. A contribution to the voltage difference along channel portion 70c comes from storage element 72b. Therefore the total voltage difference along channel portion 70c will be sensitive whether storage element 72b is programmed or not. For reading the programming state of storage element 72b a voltage $V_G^P$ can be applied to second steering gate 74b capable of opening channel portion 70c, if storage element 72b is programmed, and incapable of opening channel portion 70c, if storage element 72b is not programmed.

$V_D^R$ and $V_S^R$ voltages are applied to first and second diffusions 72a and 72b, respectively, to generate a current $I_{DS}$ across channel 70, which is indicative whether storage element 72b is programmed or not.

As shown in FIG. 5d, for reading the polarity of the first and second diffusion voltages may be reversed relative to the programming. Again the convention is followed that the higher of the two diffusion voltages is identified as $V_D$ and the lower one as $V_S$.

The voltage difference $V_D^R-V_S^R$ can be smaller than $V_D-V_S^{PGM}$, generating a smaller $I_{DS}$. In some embodiments a sense amplifier can be coupled to first or second diffusions 64 or 68, to be used for amplifying the current $I_{DS}$. This allows for an easier evaluation of $I_{DS}$ and correspondingly the programming state of storage element 72b.

FIG. 6 shows some further embodiment of the invention. As show in FIG. 6a, memory cells 50-1 through 50-p are arranged in a regular array of rows and columns. FIG. 6a shows an array of dual memory cells of the type shown in FIG. 5, but arrays of the memory cells shown in FIG. 3 and FIG. 4 are also meant to be included in the scope of the invention.

The architecture of the memory cells is described in relation to memory cell 50-1. The dual cell memory cell 50-1 includes semiconductor substrate 60, semiconducting channel 70-1, first diffusion 64-1 and second diffusion 68-1, all formed in substrate 60. First storage element 72a-1 and second storage element 72b-1 are partially overlying channel 70-1, insulated from channel 70-1 by a dielectric layer. At least partially overlying first storage element 72a-1 and second storage element 72b-1 are first steering gate 74a-1 and second steering gate 74b-1, respectively, insulated from storage elements 72a-1 and 72b-1 by a dielectric layer. The aforementioned elements of the cell can be formed, for example, in silicon by ion implantation, diffusion, and etching, to yield conductively doped polycrystalline silicon, or polysilicon. The doping can be either n- or p-type. The steering gates in adjacent rows can be aligned and coupled by steering lines 80-1 through 80-t. Also, the diffusions in adjacent rows can be aligned and coupled by bit lines 84-1 through 84-u, and the select gates in adjacent columns can be aligned and coupled by word lines 88-1 through 88-v, where t, u, and v are positive integers. In some related embodiments steering gates 74b-1 and 74a-2 form separate steering lines across the rows, thus there are two steering lines for every cell in a row.

Figure 6A:
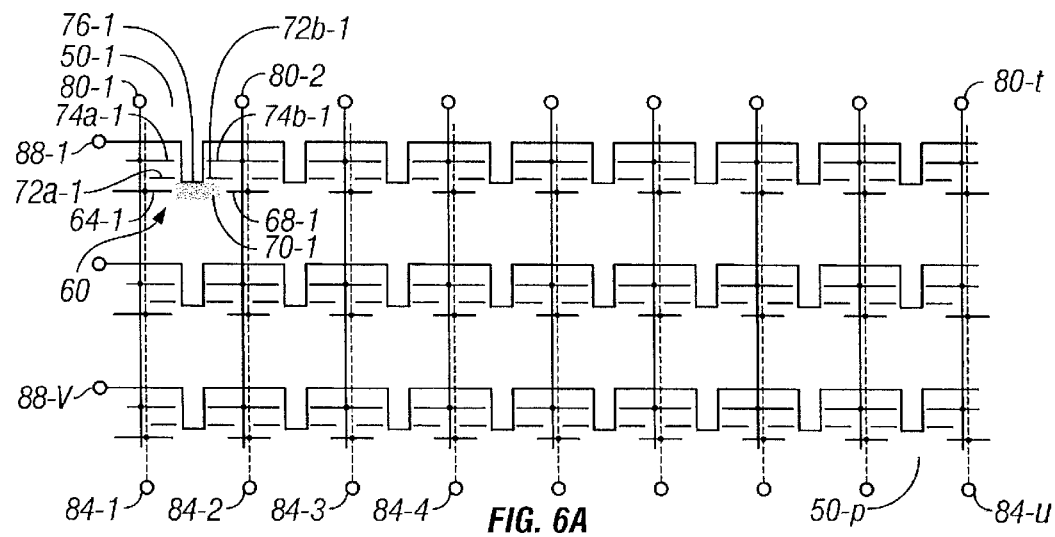
FIGS. 6a–h. Array of dual memory cells and voltage levels for programming and reading.
Figure 6B:
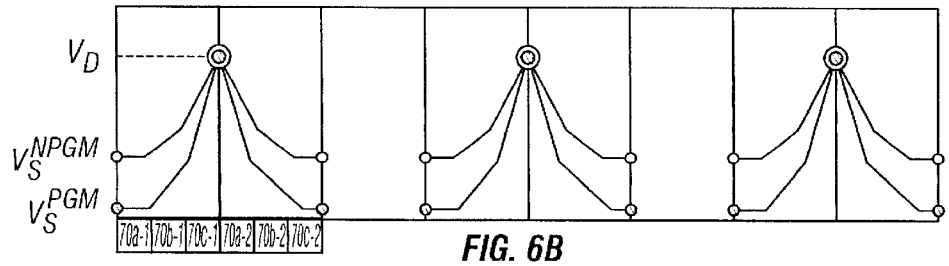

FIG. 6b shows the voltages for programming memory cells 50-1 through 50-p by solid symbols, and for non-programming by open symbols. According to this embodiment the programming of memory cells 50-1 through 50-p includes selecting a row by applying a voltage to the corresponding word line, then programming memory cells 50-1 through 50-p in pairs, separated by at least one memory cell. While FIG. 6b shows the pairs separated by a single memory cell, embodiments where the pairs are separated by several memory cells are also intended to be within the scope of the invention.

According to this embodiment two memory cells can be programmed simultaneously. This method has the advantage of programming in fewer steps than previous memory systems, where cells were programmed individually. Programming in fewer steps facilitates faster programming of the array. A second advantage is that applying the high programming voltages induces wear of the cells and corresponding circuitry. Thus programming two cells with only one bit line raised to the high programming voltage extends the lifetime of the memory array. As an example, the pair wise programming of storage elements 72b-1 and 72a-2 in memory cells 50-1 and 50-2, respectively, will now be described. Again, open symbols indicate non-program voltages and solid symbols indicate program voltages. As shown in FIG. 6b, a $V_D$ voltage can be applied to bit line 84-2, irrespective whether cells 50-1 and 50-2 are to be programmed or not. A voltage $V_S$-1 can be applied to first diffusion 64-1 via bit line 84-1 and a voltage $V_S$-2 can be applied to second diffusion 68-2 via bit line 84-3. The $V_S$-1 and $V_S$-2 voltages of memory cells 50-1 and 50-2, respectively, are chosen according to the data to be programmed. Since the $V_S$-1 and $V_S$-2 voltages are lower than $V_D$, this embodiment again offers the advantages associated with programming the data at low voltages, as described above.

Storage element 72b-1 will be programmed, if the $V_S$-1 voltage is applied to bit line 84-1 with a value $V_S^{PGM}$ so that $V_D$-$V_S^{PGM}$ exceeds $V_P$, and it will not be programmed if the $V_S$-1 voltage is applied with a value $V_S^{NPGM}$ so that $V_D$-$V_S^{NPGM}$ is less than $V_P$. Applying a $V_S^{NPGM}$ voltage can be achieved by setting $V_S$-1 to a value $V_S^{NPGM}$, or by letting $V_S$-1 float by disconnecting corresponding bit line 84-1 from the rest of the circuit. Storage element 72a-2 can be simultaneously programmed by applying a $V_S$-2 voltage to bit line 84-3 according to the same scheme. It is noteworthy that the voltages of bit lines 84-3 and 84-4 are both lower than $V_D$ during programming according to the present embodiment. Consequently the difference of these voltages does not exceed $V_P$, and it is thus insufficient to generate an appreciable current between bit lines 84-3 and 84-4. The lack of an appreciable current and thus lack of interference between the pairs of programmed memory cells is called a "no-disturb" condition. With this concept, applying the $V_S^{NPGM}$ voltage to bit lines 84-1 and 84-3 can be described as implementing no-disturb conditions on bit lines 84-1 and 84-3. Again, programming can be achieved by methods other than hot electrons as well, including utilizing electron tunneling from channel 70-1 onto storage element 72b-1.

Figure 6C:
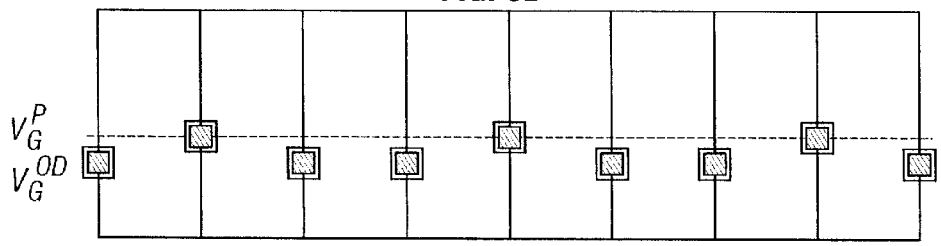

As shown in FIG. 6c, a $V_G^{OD}$ overdrive voltage is applied to steering gates 74a-1 and 74b-2 via steering lines 80-1 and 80-3, respectively, to unconditionally open channel portions 70a-1 and 70c-2 for transport. As shown in FIG. 6b, because of the non-linear current voltage characteristics of the device, at the $V_G^{OD}$ voltage large $I_{DS}$-1 and $I_{DS}$-2 currents can be sustained with moderate voltage changes along channel portions 70a-1 and 70c-2. It is noteworthy that currents $I_{DS}$-1 and $I_{DS}$-2 are flowing towards shared bit line 84-2. Currents $I_{DS}$-1 and $I_{DS}$-2 then enter channel portions 70b-1 and 70b-2. A common voltage can be applied to select gates 76-1 and 76-2 via word line 88-1 so that a bigger voltage difference is experienced by currents $I_{DS}$-1 and $I_{DS}$-2 in channel portions 70b-1 and 70b-2, than in channel portions 70a-1 and 70c-2, thus the energy of the electrons increases in these channel portions and they become hot electrons. In channel portions 70c-1 and 70a-2 these hot electrons can be diverted to storage elements 72b-1 and 72a-2 by the voltage of steering gates 74b-1 and 74a-2, respectively. In some embodiments steering gate 74b-1 and 74a-2 can be electrically coupled, thus experiencing the same voltage, via steering line 80-2. The diverted electrons can charge up either storage element 72b-1 or 72a-2, in effect programming them, if either storage element 72b-1 or 72a-2 is to be programmed, respectively. A voltage is applied to shared select gates 76-1 and 76-2 via word line 88-1 to generate hot electrons.

Memory cells 50-1 and 50-2 share bit line 84-2, steering line 80-2, and word line 88-1. According to the present embodiment during programming the voltages of these shared lines are all independent of the data to be programmed into memory cells 50-1 and 50-2. This is the feature, which enables the simultaneous programming of both cells.

Figure 6D:
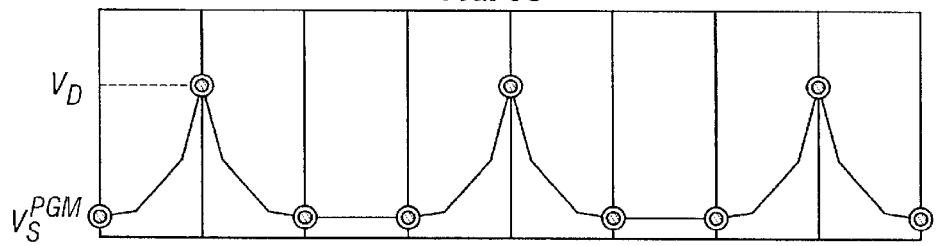
Figure 6E:
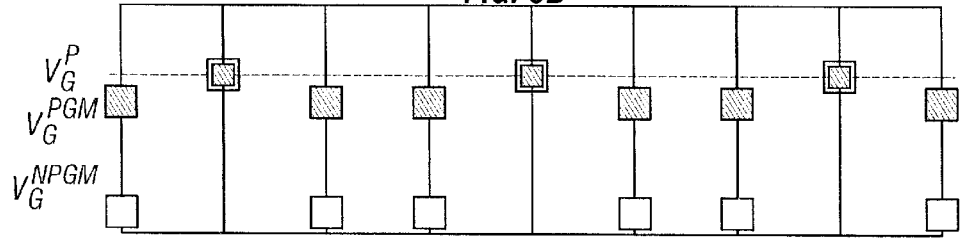

FIGS. 6d and 6e show another embodiment, where memory cells 50-1 through 50-p are programmed pair wise. In this embodiment, however, data dependent voltages are applied to the steering gates to program the memory cells. As described above, an advantage of the pair wise programming is that the array of memory cells can be programmed in fewer steps than in previous memory systems. This on one hand allows for a faster programming of the memory system and on the other hand requires fewer instances at which a bit line has to be raised to a high programming voltage, extending the lifetime of the memory system. As for the previous embodiment, the example described below has one memory cell between pairs of programmed memory cells, however the scope of the invention is intended to include other embodiments where several memory cells are in between the programmed cells.

In FIG. 6d the voltages of the first and second diffusions do not change depending on whether the cells are to be programmed or not. A $V_D$ voltage is applied to second diffusion 74b-1 and first diffusion 74a-2 via shared bit line 84-2. A voltage $V_S^{PGM}$ is applied to first diffusion 74a-1 via bit line 84-1 and to second diffusion 74b-2 via bit line 84-3 to enable the programming of storage elements 72b-1 and 72a-2, respectively. This requires that $V_D$-$V_S^{PGM}$ exceed $V_P$. Applying a voltage $V_S^{PGM}$ includes setting voltage $V_S^{PGM}$ to ground voltage $V_{GND}$. The variation of the voltages along channels 70-1 and 70-2 is analogous to the previous embodiment in case of programming storage elements 72b-1 and 72a-2.

In FIG. 6e a voltage $V_G^P$ is applied to steering gates 74b-1 and 74a-2 via steering line 80-2. In some embodiments steering gates 74b-1 and 74a-2 can be coupled, thus experiencing the same voltage. The $V_G^P$ voltage is chosen such that it is capable diverting currents $I_{DS}$-1 and $I_{DS}$-2 onto storage elements 72b-1 and 72a-2, respectively. Whether storage elements 72b-1 and 72a-2 will be programmed or not can be controlled by the voltages of steering gates 74a-1 and 74b-2. If a voltage $V_G^{PGM}$ is applied to steering gates 74a-1 or 74b-2 via steering lines 80-1 or 80-3, respectively, which is capable of opening channel portions 70a-1 or 70c-2, then a current $I_{DS}$-1 or $I_{DS}$-2 will be able to flow in channel 70-1 or 70-2, causing the charging, or programming, of storage elements 72b-1 or 72a-2, respectively. If, however, a voltage $V_G^{NPGM}$ is applied to steering gates 74a-1 or 74b-2 via steering lines 80-1 or 80-3, respectively, which is not capable of opening channel portions 70a-1 or 70c-2, then a current $I_{DS}$-1 or $I_{DS}$-2 will not be able to flow in channel 70-1 or 70-2, causing storage elements 72b-1 or 72a-2 not to be charged, or programmed, respectively. Applying a $V_G^{NPGM}$ voltage includes setting the $V_G$ voltage to ground voltage $V_{GND}$.

Figure 6F:
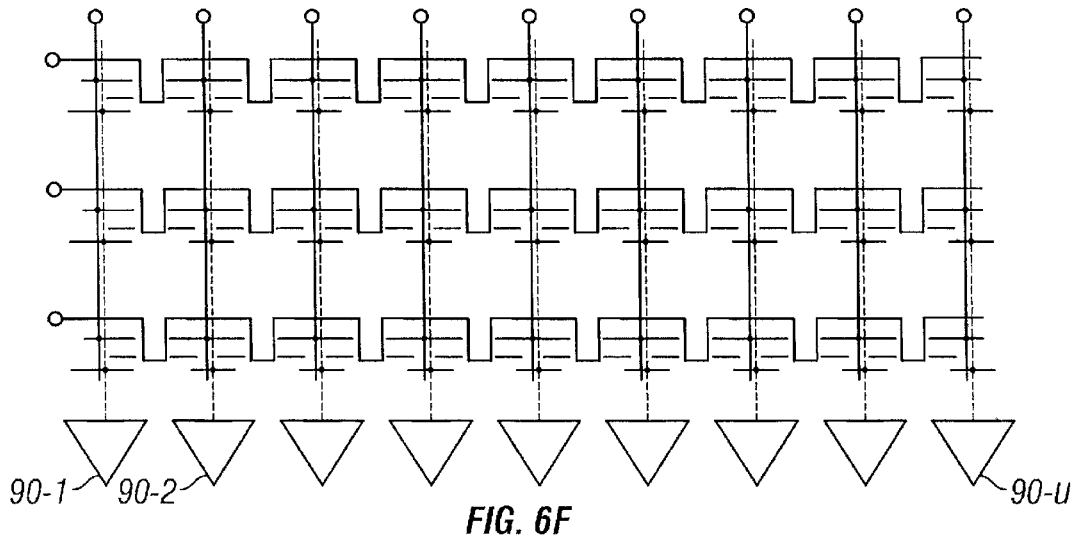

FIG. 6f shows the same array of memory cells 50-1 through 50-p with the added feature of sense amplifiers 90-1 through 90-u coupled to bit lines 84-1 through 84-u.

Figure 6G:
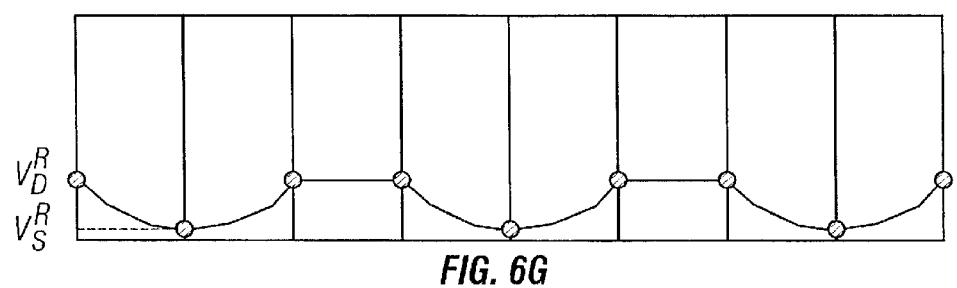
Figure 6H:
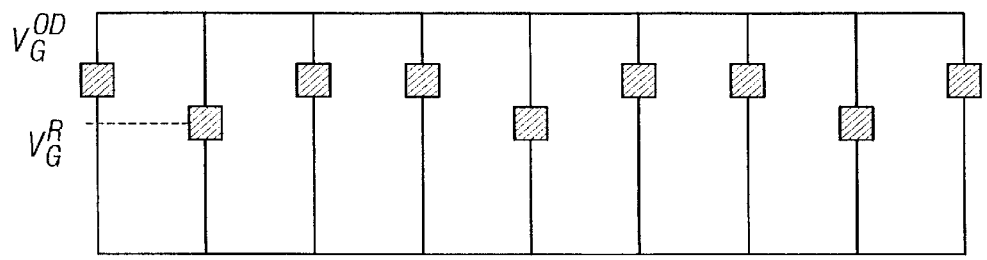

FIGS. 6g and 6h illustrate the reading of the programmed data from memory cells 50-1 through 50-p. In analogy to the programming the reading can be performed in pairs, allowing for a faster readout. The reading will be demonstrated on the example of the voltages of storage elements 72b-1 and 72a-2, and the reading voltages will be indicated by shaded symbols. As shown in FIG. 6g, a $V_G^{OD}$ voltage can be applied to steering gates 74a-1 and 74b-2 via steering lines 80-1 and 80-3 to unconditionally open channel portions 70a-1 and 70c-2, respectively. As discussed above, the electrons of a charged storage element modulate the current of channel 70-1 or 70-2. Thus a $V_G^R$ voltage can be applied to steering gates 74b-1 and 74a-2 via steering line 80-2 such that $V_G^R$ opens channel portion 70c-1 or 70a-2, if storage element 72b-1 or 72a-2 is not programmed and $V_G^R$ does not open channel portion 70c-1 or 70a-2, if storage element 72b-1 or 72a-2 is programmed.

FIGS. 6g–6h show the reading voltages for both of the embodiments of FIGS. 6b–6c and FIGS. 6d–6e. A $V_D^R$ voltage is applied to first diffusion 74a-1 and second diffusion 74b-2 via bit lines 84-1 and 84-3, and a $V_S^R$ voltage is applied to second diffusion 74b-1 and first diffusion 74a-2 via shared bit line 84-2. $V_D^R$ and $V_S^R$ are chosen so that the value of currents $I_{DS}$-1 and $I_{DS}$-2, generated by the $V_D^R$-$V_S^R$ voltage difference, be indicative whether channel 70-1 or 70- is open or not. Channel 70-1 or 70-being open or not in turn indicates whether storage element 72b-1 or 72a-2 is programmed or not. Since currents $I_{DS}$-1 and $I_{DS}$-2, generated by the $V_D^R$-$V_S^R$ voltage difference, can be small, sense amplifiers 90-1 through 90-t can be coupled to bit lines 80-1 through 80-t to amplify the generated currents.

In the above embodiments the information is coded in the amount of charge stored on the storage elements. In some embodiments a positive and a negative charge state is used to store information in binary form. In other embodiments, however, the storage elements can be charged to several different charge levels, thus storing multi-valued information. Some embodiments can utilize up to sixteen different charge levels. One way to charge the storage elements to different charge levels is to carry out the charging process for different time intervals.

Although the various aspects of the present invention have been described with respect to certain preferred embodiments, it is understood that the invention is entitled to protection within the full scope of the appended claims.

In the claims:

1. A method of programming one or more memory cells that individually comprise a first diffusion and a second diffusion, comprising
   applying a first voltage to the first diffusion, sufficient to enable programming the memory cell, independent of whether the memory cell is to be programmed or not; and
   simultaneously applying a second or a third voltage to the second diffusion according to whether the memory cell is to be programmed or not,
   wherein the second voltage is less than the first voltage.

2. The method of claim 1, wherein the second voltage is capable of causing the memory cell to be programmed, and the third voltage is not capable of causing the memory cell to be programmed, wherein the second voltage is lower than the third voltage.

3. The method of claim 1, wherein the memory cell comprises a semiconductor channel coupling the first and second diffusions, capable of opening, one or more storage elements at least partially overlying the semiconductor channel, and one or more gates at least partially overlying the one or more storage elements, wherein the programming comprises
   applying gate voltages to the one or more gates, sufficient to enable the programming of the memory cell.

4. The method of claim 3, wherein the one or more gates comprise a select gate, at least partially overlying the storage element, wherein applying gate voltages comprises
   applying a fourth voltage to the select gate sufficient to enable the programming of the memory cell.

5. The method of claim 3, wherein the one or more storage element comprises a storage element, at least partially overlying the semiconductor channel and the one or more gates comprise a select gate, at least partially overlying the storage element, and at least partially overlying the semiconductor channel, wherein applying gate voltages comprises
   applying a fifth voltage sufficient to enable the programming of the memory cell.

6. The method of claim 3, wherein the one or more storage elements comprise a first and a second storage element, partially overlying the semiconductor channel, the one or more gates comprise a first and a second steering gate, at least partially overlying the corresponding first and second storage elements, and a select gate, at least partially overlying the semiconductor channel, wherein applying gate voltages comprises
   applying a sixth voltage to the first steering gate sufficient to open the semiconductor channel; and
   applying a seventh voltage to the second steering gate sufficient to enable the programming of the second storage element of the memory cell.

7. The method of claim 3, wherein the second, third and gate voltages have several levels, sufficient to program multi-valued data into at least one of said memory cells.

8. In an array of memory cells arranged in rows and columns that comprises bit lines extending in a direction along the columns, a method of programming the memory cells, comprising:
   identifying, for simultaneous programming, a plurality of pairs of first and second adjacent memory cells along a row with at least one cell positioned between adjacent pairs, said pairs individually comprising a shared bit line between them, a first bit line coupled to the first cell and a second bit line coupled to the second cell;
   applying a first voltage to the shared bit lines of the individual pairs that is sufficient to enable the programming of the pairs' first and second cells; and
   applying either a second or a third voltage to each of the first and second bit lines of the individual pairs according to whether the respective first or second cells are to be programmed or not.

9. The method of claim 8, wherein the second voltage is less than the first voltage.

10. The method of claim 8, wherein the second voltage is less than the third voltage.

11. The method of claim 8, wherein the third voltage is less than the first voltage.

12. The method of claim 8, wherein the memory cells individually comprise semiconductor channels, capable of opening, and wherein the memory cells are individually coupled to steering lines, the steering lines extending in a direction along the columns, wherein the programming comprises
   applying a fourth voltage to the steering lines of the individual pairs, capable of opening the semiconductor channels of the respective memory cells.

13. The method of claim 8, wherein the memory cells individually comprise two storage elements, and the pairs of memory cells individually comprise adjacent storage elements, wherein
   the adjacent storage elements are being programmed.

14. The method of claim 13, wherein the memory cells individually comprise semiconductor channels, capable of opening, and wherein the memory cells are individually coupled to two steering lines, corresponding to the two storage elements of the cell, the steering lines extending in a direction along the columns, wherein the programming comprises applying a fifth voltage to the steering lines, corresponding to the adjacent storage elements of the individual pairs, that is sufficient to enable the programming of the adjacent storage elements; and applying a sixth voltage to the steering lines, corresponding to the non-adjacent storage elements of the individual pairs, capable of opening the semiconductor channels of the respective memory cells.

15. The method of claim 8, wherein the first, second, and third voltages have several levels, sufficient to program multi-valued data into at least one of the memory cells.

16. The method of claim 8, wherein the first, second, and third voltages are applied for different time intervals, sufficient to program multi-valued data into at least one of the memory cells.

17. In an array of memory cells arranged in rows and columns that comprises steering lines extending in a direction along the columns, a method of programming the memory cells:

identifying, for simultaneous programming, a plurality of pairs of first and second adjacent memory cells along a row with at least one cell positioned between adjacent pairs; and applying either a first or a second voltage to each of the steering lines of the individual pairs according to whether the respective first or second cells are to be programmed or not.

18. In an array of memory cells arranged in rows and columns that comprises steering lines extending in a direction along the columns, the memory cells being coupled individually to two steering lines, a method of programming the memory cells:

identifying, for simultaneous programming, a plurality of pairs of first and second adjacent memory cells along a row with at least one cell positioned between adjacent pairs, said pairs individually comprising two adjacent steering lines and a first steering line coupled to the first cell and a second steering line coupled to the second cell;

applying a first voltage to the adjacent steering lines of the individual pairs that is sufficient to enable the programming of the pairs' first and second cells; and applying either a second or a third voltage to each of the first and second steering lines of the individual pairs according to whether the respective first or second cells are to be programmed or not.

19. The method of claim 18, wherein the memory cells individually comprise a semiconductor channel, capable of opening, wherein the second voltage is capable of opening the semiconductor channel; and the third voltage is not capable of opening the semiconductor channel.

20. The method of claim 18, wherein the third voltage is less than the second voltage.

21. The method of claim 18, wherein the pairs individually comprise a shared bit line between them, a first bit line coupled to the first cell and a second bit line coupled to the second cell, the bit lines extending in a direction along the columns, wherein the programming comprises applying a fourth voltage to the shared bit line of the individual pairs that is sufficient to enable the programming of the pairs' first and second cells; and applying a fifth voltage to each of the first and second bit lines of the individual pairs, wherein the fifth voltage is less than the fourth voltage.

22. The method of claim 18, wherein the first, second, and third voltages have several levels, sufficient to program multi-valued data into at least one of the memory cells.

23. The method of claim 18, wherein the first, second, and third voltages are applied for different time intervals, sufficient to program multi-valued data into at least one of the memory cells.

24. In an array of memory cells arranged in rows and columns that comprises bit lines extending in a direction along the columns, a method of reading the memory cells, comprising:

identifying, for simultaneous reading, a plurality of pairs of first and second adjacent memory cells along a row with at least one cell positioned between adjacent pairs, said pairs individually including a shared bit line between them, a first bit line coupled to the first cell and a second bit line coupled to the second cell;

applying a first voltage to the shared bit lines of the individual pairs that is sufficient to enable the reading of the pairs' first and second cells;

applying a second voltage to the first and second bit lines of the individual pairs, sufficient to enable the reading of the pairs' first and second cells; and sensing the current, generated through the first and second bit lines of the individual pairs, to read the memory cells.

25. The method of claim 24, wherein the bit lines are coupled to sense amplifiers individually, wherein the sensing of the current comprises driving the current of the bit lines individually through the sense amplifiers; and sensing the amplified current of the bit lines individually to read the memory cells.

26. The method of claim 24, wherein the first voltage is less than the second voltage.

27. The method of claim 24, wherein the memory cells individually comprise semiconductor channels, capable of opening, and the pairs individually comprise adjacent steering lines, a first steering line coupled to the first cell and a second steering line coupled to the second cell, the steering lines extending in a direction along the columns, wherein the reading comprises applying a third voltage to the adjacent steering lines of the individual pairs that is sufficient to enable the reading of the pairs' first and second cells; and applying a fourth voltage to each of the first and second steering lines of the individual pairs, capable of opening the respective semiconductor channels of the memory cells.

28. The method of claim 24, wherein the currents have several values, capable of reading several states of the memory cells individually.

* * * * *